United States Patent [19]

Tarle

[11] 4,394,307

[45] Jul. 19, 1983

[54] TRACK RECORDING PLASTIC COMPOSITIONS

[76] Inventor: Gregory Tarle, 2665 Kenney Dr., San Pablo, Calif. 94806

[21] Appl. No.: 235,691

[22] Filed: Feb. 18, 1981

[51] Int. Cl.$^3$ ............................................. C08K 5/11
[52] U.S. Cl. ................................... 524/776; 526/314; 525/5; 250/473.1; 524/296; 524/297
[58] Field of Search .................. 260/31.8 R; 526/314; 525/5

[56] References Cited

U.S. PATENT DOCUMENTS

| | | | |
|---|---|---|---|
| 2,384,115 | 9/1945 | Muskat et al. | 260/28 |
| 2,964,501 | 12/1960 | Sarofeen | 260/77.5 |
| 3,335,278 | 8/1967 | Price et al. | 250/83.1 |
| 3,665,194 | 5/1972 | Alter et al. | 250/83 CD |
| 4,186,234 | 1/1980 | Sakashita et al. | 428/283 |

*Primary Examiner*—Joseph L. Schofer
*Assistant Examiner*—Bernard Lipman
*Attorney, Agent, or Firm*—Phillips, Moore, Lempio & Finley

[57] ABSTRACT

Improved nuclear track recording plastic compositions are provided which exhibit greatly decreased surface roughness when etched to produce visible tracks of energetic nuclear particles which have passed into and-/or through said plastic. The improved compositions incorporate a small quantity of a phthalic acid ester into the major plastic component which is derived from the polymerization of monomeric di-ethylene glycol bis allyl carbonate. Di-substituted phthalic acid esters are preferred as the added component, with the further perference that the ester substituent has a chain length of 2 or more carbon atoms. The inclusion of the phthalic acid ester to an extent of from about 1-2% by weight of the plastic compositions is sufficient to drastically reduce the surface roughness ordinarily produced when the track recording plastic is contacted by etchants.

15 Claims, 1 Drawing Figure

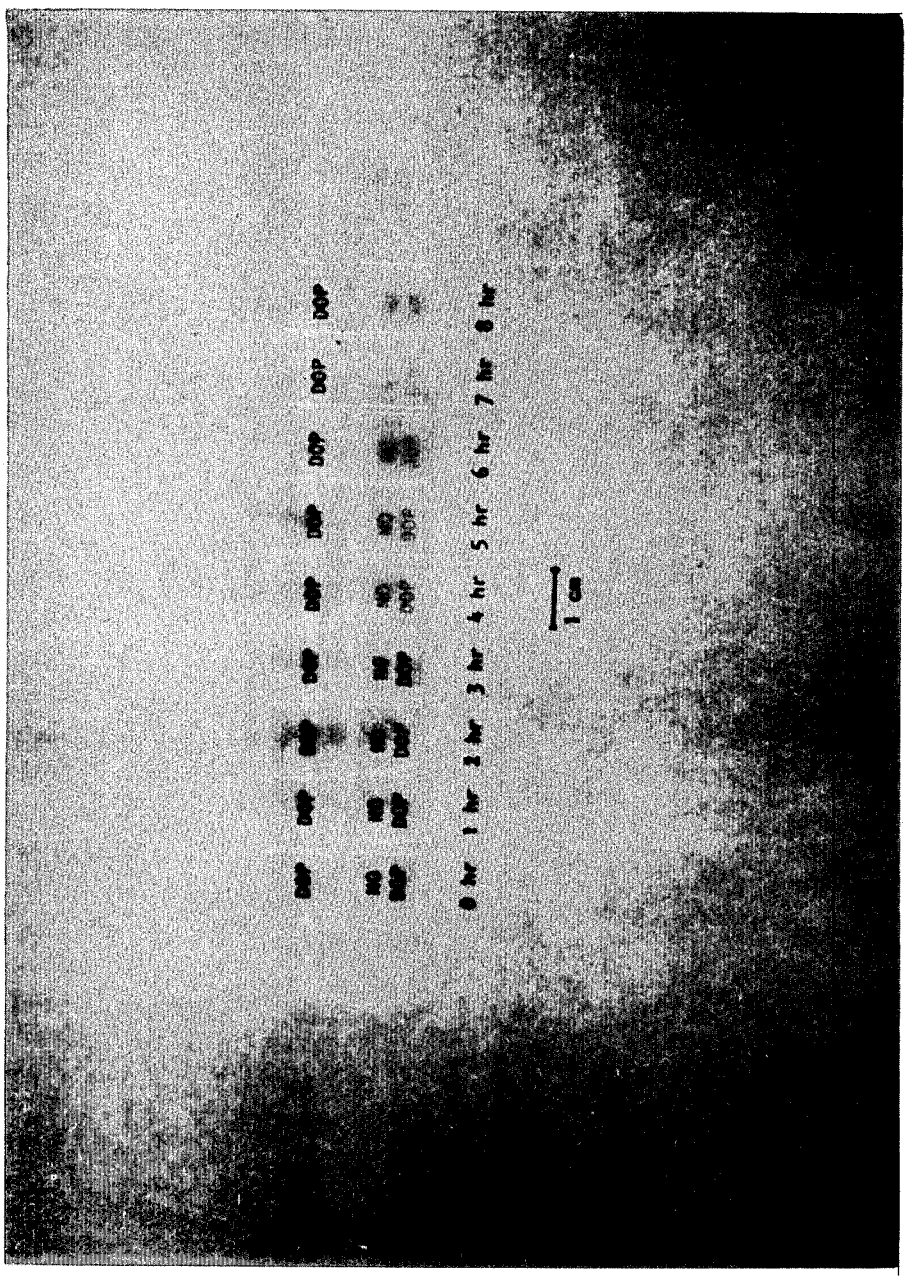

TRACK RECORDING PLASTIC COMPOSITIONS

The invention described herein was made in the performance of work under a NASA contract and is subject to the provisions of Section 305 of the National Aeronautics and Space Act of 1958, Public Law 85-568 (72 STAT. 435:42 U.S.C. 2457).

DESCRIPTION

1. Field of the Invention

This invention concerns nuclear particle track recording plastic compositions. Such compositions have improved etching properties wherein the recording plastic surfaces remain smooth and transparent even after deep etching which is needed to reveal and develop tracks made by nuclear particles passing into and/or through the recording plastic.

2. Background of the Invention

The recordation of the passage of nuclear particles is, and has been, vital to the physicists' study of the composition of matter and the interaction of nuclear material. It is also important for the monitoring of radiation fields in order to determine radiation dosages received by materials and personnel subjected to the radiation.

Early techniques for viewing such activity utilized the Wilson cloud chamber wherein the passage of energetic nuclear particles caused the condensation of minute water droplets in a water vapor saturated atmosphere. Such devices however afforded only a transitory glimpse of the particle paths and more stable and sensitive techniques were needed. The next stage in nuclear particle path recording devices were bubble chambers which utilized organic and/or inorganic liquids to record the passage of nuclear particles. In such devices the passage of a nuclear particle released energy into the liquid resulting in vaporization of the liquid molecules along the pathway. Visible trails of bubbles recorded the passage of an energetic nuclear particle. Like cloud chambers, however, such bubble paths are transitory and different particles of varying energies are not necessarily recorded with like sensitivity.

In some instances, photographic films can be utilized to record total radiation dosage, however, individual particle paths and resolution of one particle from another has been difficult.

The continued search for more permanent, more sensitive recording media has been rewarded in the past decade or so with the discovery that a rather large number of commercially available polymeric organic materials, e.g., cellulosic plastics, such as cellulose nitrate and cellulose acetate, and poly carbonates, such as Lexan, are capable of recording the passage of energetic nuclear particles as they pass through the polymeric material. In fact the passage of the particle releases energy into the surrounding polymeric material along the pathway and this energy release damages the chemical bonds linking the plastic molecules. This damage may be revealed by contacting the plastic with a suitable chemical agent to etch or "eat away" susceptible portions of the polymeric material. The etchants more quickly attack the damaged portion of the plastic, with the result that the plastic material in and adjacent to the particle track is dissolved at a faster rate than the undamaged portions. Thus a visible cone is developed in the plastic surface to reveal the passage of an energetic nuclear particle. The size of the cone is directly proportional to the energy of the particle passing into and/or through the plastic.

Since material is actually etched away from the recording plastic, a permanent record is made of the nuclear particle flux to which the plastic has been exposed. In addition to the usefulness of this phenomenon in experimental physics, track recording plastics have also found use in personnel dosimetry and uranium prospecting.

Although track recording polymers have demonstrated an advance over previous track recording techniques their usefulness is impaired by the fact that during the etching process, a considerable amount of roughness develops over the entire plastic surface. This roughness tends to mask the true particle cones and interferes with automated scanning procedures utilized in detecting and counting the nuclear particle tracks.

This defect has been greatly relieved with the discovery by Cartwright et. al. (Nuclear Instruments and Methods, 153, pp. 457–460, 1978) that the plastic polymer derived from di-ethylene glycol bis allyl carbonate (commercially known and available as CR-39) is not subject to the development of surface roughness upon etching to an extent nearly as great as with prior plastics such as Lexan etc. CR-39 also has an additional advantage in that it is very highly sensitive to all types and energies of nuclear particles. It is even capable of recording the passage of alpha particles and low energy protons. Thus the CR-39 has become the polymer of choice for use in recording nuclear particle paths.

Despite its great improvement in reducing "surface background" in the detection of nuclear particle paths, CR-39, upon prolonged etching, also begins to develop some surface roughness. This roughness interferes with the detection of particle paths where high sensitivity demands a more severe etch. Under such conditions automatic scanning systems are useless, and even human observation has difficulty in picking out actual particle paths from spurious surface roughness.

This problem has been overcome by the present invention. Further understanding of the advance will appear from the following description.

BRIEF SUMMARY OF THE INVENTION

A track recording plastic composition whose surface resists roughening by etchants without interfering with the development of nuclear particle tracks therein has been devised.

Specifically, the invention composition comprises a major amount of polymeric di-ethylene glycol bis allyl carbonate (hereinafter referred to as CR-39)to which is added a small amount of a phthalic acid ester, and in particular those phthalic acid esters which are either mono- or di-substituted with alkyl moieties having at least 2 carbon atoms, i.e., ethyl, and more. The phthalic acid ester may comprise only a small proportion of the plastic, e.g., in the order perhaps 1–2% by weight of the total composition.

The di-substituted phthalates are preferred as the additives, although the mono-substituted phthalates also reduce surface roughening of the CR-39. However, the mono-substituted esters possess a free acid group and this group can react with the etchant, i.e., alkali metal hydroxide, to produce water as a reaction product. The water thus produced tends to swell the recording plastic. This swelling is undesirable where precise measurement of track cones is necessary to determine particle energies. Therefore, in most instances the di-substituted phthalate esters are preferred to the mono-substituted-compounds. However, where such precise measurements are unnecessary, the mono-substituted esters are perfectly satisfactory.

The chain length of the ester substituent is also quite important to produce the desired smoothing effect. Thus the methyl substituted phthalate esters when added to CR-39 produces no visible decrease in the surface roughness under the usual etching procedures. The di-ethyl phthalate when added does produce a visible smoothing effect, however, not to the same extent as does the higher chain length substituents. In fact, as the chain length of the ester substituent increases, so does the apparent smoothing effect. When dioctyl phthalate is added, even prolonged etching (8 hours or more) produces no visible roughening of the CR-39 surface.

It has been previously noted that when CR-39 is polymerized and molded its sensitivity is high enough to record nuclear tracks caused by the plastic's exposure to radioactive nuclei in the mold materials and radon in the air. This produces a "background" of tracks which may interfere with snesitive low level neutron density measurements. In such applications, it is customary to pre-etch the plastic before use in such measurements. The addition of the anti-roughening agents of the present invention to the CR-39 plastic, permits pre-etching without the attendant roughening of the plastic surface. Thus, the "background" tracks may be etched away without interfering with the subsequent exposure and etching of the plastic to reveal the desired nuclear tracks.

It is therefore an object of the invention to reduce, or eliminate, the surface roughening of nuclear track recording plastic, CR-39, when said plastic is etched to produce a visible record of nuclear tracks.

It is another object of the invention to reduce the roughening of the surface of CR-39 nuclear track recording plastics caused by etchant, by adding to said plastics an anti-roughening agent.

It is a further object of the invention to reduce the etchant caused roughening of CR-39 nuclear track recording plastic by incorporating a minor amount of a phthalic acid ester into the CR-39 plastic.

It is still another object of the invention to provide a nuclear track recording plastic that is resistant to having its surface roughened when contacted with an etchant.

It is yet another object of the invention to provide an improved nuclear track recording plastic.

It is yet another object of the invention to provide an improved nuclear track recording plastic comprising a major proportion of polymeric diethylene glycol bis allyl carbonate, and a minor proportion of phthalic acid ester.

It is yet another object of the invention to permit pre-etching of CR-39 plastic surfaces to remove "background" tracks without roughening the plastic surface.

Other objects and advantages of the invention will be apparent from a review of the following specification, drawing, and the claims appended hereto.

BRIEF DESCRIPTION OF THE DRAWING

The single FIGURE of the drawing is a photograph of a number of samples of CR-39 nuclear track recording plastic. One group of the samples are unmodified CR-39; while a second group of the samples are CR-39 plastic that was modified by the addition of the phthalic acid ester, dioctyl phthalate (DOP), thereto. The samples were subjected to etching by hot concentrated sodium hydroxide for various periods of time as indicated in the photograph.

DETAILED DESCRIPTION OF THE INVENTION

A nuclear track recording plastic with increased resistance to developing surface roughness when etched is prepared from monomeric di-ethylene glycol bis allyl carbonate (CR-39). The improved recording plastic incorporates a small percentage of a phthalic acid ester, preferably a di-ester, into the polymerized product.

Specifically, monomeric CR-39 (commercially available from PPG Industries) is mixed with a suitable free radical initiator, e.g., di-isopropyl peroxy-dicarbonate, to polymerize the CR-39. This procedure is standard for the preparation of polymerized CR-39, which is a hard, clear, transparent water-white polymer. During the polymerization process, the liquid monomer with the initiator is cast in molds of suitble shape.

In the practice of the invention, a small amount of a phthalic acid ester is added to the monomer concurrently with the initiator. Thus, the CR-39 product incorporates the ester into the resulting solidified polymer.

Polymerization is brought about by subjecting the CR-39 monomer, initiator, and phthalate ester mixture to a thermosetting process over a period of several days. The mixture is gradually heated from about 30° to 85° C. over a three day cycle, whereby the liquid CR-39 monomer undergoes polymerization to the solid polymer product.

The major and principal component of the recording plastic is the well known carbonate plastic material, di-ethylene glycol bis allyl carbonate (CR-39), which has been used for a number of years as a track recording plastic as well as in the optical industry as the base for plastic optical lenses, and in other applications where a very hard, stable and highly transparent product would be of advantage. The CR-39 is obtained commercially in the monomeric form which is a clear liquid.

In order to form the hard solid polymeric product the monomer must be activated by the presence of a polymerization agent, in this case a free radical initiator e.g. di-isopropyl peroxy-dicarbonate. When mixed with the free radical initiator and subjected to an external source of heat, the CR-39 will slowly polymerize to the desired solid polymeric product. Generally polymerization takes place when the Cr-39 monomer-free radical initiator mixture is maintained in an oven which is slowly cycled through a temperature of from about 30° C. up to about 85° C. in a three day cycle.

In order to produce the improved track recording plastic of the present invention it is necessary to add to the CR-39 monomer-free radical initiator mixture a small amount of a phthalic acid ester.

Phthalic acid esters are a well known class of materials which are derivatives from the esterification reaction of phthalic acid with suitable alcohols. Phthalic acid is one of the simplest of the aromatic acids having two carboxylic acid functional groups attached directly to a benzene ring. These carboxylic acid functional groups are available to enter into esterification reactions with suitable alcohols. Under certain conditions only one of the carboxylic acid functional groups undergoes esterification. However, if the esterification reaction is permitted to go to completion in the presence of sufficient quantities of the alcohol, both carboxylic acid groups will undergo esterification to produce the di-substituted ester.

It will be appreciated that phthalic acid (which is ordinarily taken to mean the ortho acid, i.e., 1,2-benzene di-carboxylic acid) has two isomeric acids, i.e., isophthalic acid (1,3-benzenedicarboxylic acid) and terephthalic acid (1,4,-benzene-dicarboxylic acid). These isomers also form esters analogous to the phthalic acid esters discussed herein. It is believed that such related isophthalate and terephthalate esters may be substituted for the phthalate esters in the compositions of the invention. Thus whenever the phthalate esters are referred to herein, such referral should also be taken to include the related isophthalate and terephthalate esters.

A great number of the phthalic acid esters especially those produced from phthalic acid and lower molecular weight alcohols, e.g., alkyl alcohols wherein C=1 to about 14, are readily available on the commercial market. If not readily available the desired phthalic acid esters may be prepared by traditional esterification reactions between the phthalic acid and the desired alcohol.

In any event, for the purposes of the present invention, any one of a number of phthalic acid esters may be utilized as the anti-roughening agent for addition to the Cr-39 material. Generally speaking, however, the di-substituted phthalic acid esters are more desirable than the monosubstituted phthalic acid esters. In addition, only those phthalic acid esters having an ester chain length of at least two carbon atoms, produce the desired anti-roughening effect. Even more preferably, however, those phthalic acid esters having at least four or more carbon atoms in the ester chain should be utilized as the anti-roughening agent. Thus it is most advantageous to utilize di-butyl phthalate, or higher molecular weight phthalate esters. Dioctyl phthalate is especially desirable as the anti-roughening additive in view of its ready commercial availability and relatively low cost as well as its ability to produce the desired effect in low concentrations.

Only a very small percentage of the phthalic acid ester is necessary for inclusion in the CR-39 formulation. From 1 to about 2% by weight effectively reduces the roughening of the CR-39 surface when etched. In fact, it is undesirable to add more than 2% of the phthalic acid ester to the CR-39. Additional amounts of the ester do not seem to materially improve the smoothness of the etched product; and in fact, excess ester sometime creates a greasy film on the plastic surface after casting. Therefore, most usually, the phthalic acid ester is added to the CR-39 in the range of from about 1 to 1½% by weight of the composition.

The procedure for producing the improved CR-39 composition is quite simple. The desired quantity of phthalic acid ester is simply mixed into the monomeric CR-39 to which has been added the desired free radical initiator. The mixture of CR-39 monomer, free radical initiator, and phthalic acid ester is then poured into molds of the desired configuration of the final product and the filled molds are thereafter placed into a temperature controlled oven. The CR-39 is then polymerized by gradually increasing the temperature of the oven from about 30° C. to 85° C. over a period of several days. During this time the CR-39 polymerizes to produce the desired hard, solid, fully transparent plastic product. The polymerized product is thereafter removed from the oven and from the molds to yield the track detector.

Track detector plastics produced in accordance with the above-noted procedure and with the addition of phthalic acid ester are particularly resident to surface roughening when contacted by hot, caustic etchants which are customarily utilized to dissolve away those portions of the CR-39 which have been damaged by passage of a nuclear particle therethrough. In actuality, the etchant removes even undamaged portions of the plastic, but the track damaged portions are etched more quickly than the undamaged portions.

The addition of the phthalic acid ester does slightly reduce the sensitivity of the CR-39 detector, however, this slight reduction in sensitivity is more than made up by the improved surface smoothness of the etched plastic. In fact, under conditions where the plastic is etched over long periods of time to reveal even low energy particle tracks, the surface remains sufficiently smooth to enable automatic machine reading of the particle track data.

In order to demonstrate the improvement brought about by the addition of the phthalic acid ester to CR-39 the following examples are presented:

EXAMPLE I

Sufficient CR-39 polymer to produce 18 squares of detector plastic approximately 1 centimeter by 1 centimeter by 1 millimeter thick were mixed with 3% by weight of di-isopropyl peroxy dicarbonate. The monomer-initiator mixture was then divided into two equal portions, and one percent by weight of dioctyl phthalate (DOP) was added to one of the monomer-initiator portions.

Both portions, the CR-39 monomer and free radical initiator; and the CR-39 monomer, free radical initiator, and dioctyl phthalate were then cast between glass molds and placed in an oven for a three day polymerization cycle. During the cycle the oven temperature was raised from 30° C. to 85° C. Each sample polymerized to a hard optically clear solid polymer. The thickness of the cast plastic was approximately 1 mm. Both samples were then cut into 9 pieces each having dimensions of approximately 1 cm. on a side. One piece of each sample was retained in the as cast condition; while all of the remaining samples were etched at 90° C. in 6.25 N sodium hydroxide for varying periods of time up to as long as 8 hours. One sample of the ordinary plastic and the plastic with DOP added were taken for each time interval of etching. Approximately 10 micrometers of plastic material was removed from each side of each plastic sample for each hour of etching.

The duplicate sets of samples were then arrayed on a piece of clear glass raised 1.5 cm. above a printed sheet as shown in FIG. 1 of the drawing. With reference to FIG. 1 of the drawing it will be clearly seen that the plastic samples without the dioctyl phthalate additive began to show signs of roughness after three hours of etching. At six to seven hours of etching, the samples without the dioctyl phthalate became very rough and the printing illegible. At the seven hour etch, 70 micrometers of material had been removed from each side of the respective samples. By contrast, the samples which included dioctyl in the composition remained clear and transparent even through eight hours of etching.

Other samples of CR-39 having dioctyl phthalate added thereto, when etched even longer than eight hours, still remained clear and transparent.

These tests were a dramatic demonstration that the surface roughness produced by etching CR-39 track recording plastic is reduced to the vanishing point if phthalic acid ester is included in the formulation.

EXAMPLE II

In order to test the ability of other phthalic acid esters to reduce the surface roughness of etched CR-39 additional samples of the monomer were mixed with dimethyl, diethyl, dibutyl, dioctyl, and hexadecyl (5% diester, 47.5% monoester) phthalates, in the amount of 1% phthalate. These samples were then polymerized in the same manner as in Example I and subsequently about 100 micrometers of the plastic was etched off each sample with hot sodium hydroxide. A control sample of pure CR-39, and the CR-39 sample admixed with the dimethyl phthalate, exhibited very rough surfaces. The sample admixed with the diethyl phthalate at first appeared to have a rough surface, however, this sample was washed thoroughly with water, dried and resulted in a slightly clearer surface than the control sample. The other samples i.e., those in which the dibutyl, dioctyl and hexadecyl phthalates were admixed all exhibited optically clear surfaces at the end of the etch.

The above specification and the drawing all demonstrate that the surface roughness brought about by etching CR-39 track recording plastic surfaces can be reduced and virtually eliminated by the inclusion of small amounts of phthalic acid esters in the plastic composition. The examples set forth above are presented as merely illustrative of the invention and the application of the invention to track recording compositions.

I claim:

1. An improved nuclear particle track recording solid plastic composition consisting essentially of about 98% by weight of polymeric di-ethylene glycol bis allyl carbonate and an effective amount to reduce roughening caused by etchants up to about 2% by weight of a alkyl phthalic acid ester admixed therein.

2. The improved recording plastic composition of claim 1 wherein said phthalic acid ester is a di-substituted ester.

3. The improved track recording plastic of claim 1 wherein the phthalic acid ester is a mono-substituted ester, or mixtures of di-substituted and mono-substituted esters.

4. The improved track recording plastic of claim 1 wherein the alcohol derived substituent on the phthalic acid ester includes at least two or more carbon atoms in the ester substituent chain.

5. The improved track recording plastic composition of claim 1 wherein the di-substituted phthalic acid ester is di-octyl phthalate.

6. In a track recording solid plastic composition consisting essentially of polymerized diethylene glycol bis allyl carbonate, the improvement comprising including in said composition an effective amount to reduce roughening caused by etchants up to about 2% by weight of a alkyl phthalic acid ester in the di-ethylene glcyol bis allyl carbonate.

7. The improvement of claim 6 wherein the phthalic acid ester is a di-substituted ester.

8. The improvement of claim 6 wherein the phthalic acid ester is a mono-substituted ester, or a mixture of a mono-substituted and a di-substituted ester.

9. The improvement of claim 6 wherein the ester substituents on the phthalic acid include at least two or more carbon atoms.

10. The improvement of claim 7 wherein the di-substituted phthalic acid ester is dioctyl phthalate.

11. A method for producing an improved nuclear particle track recording plastic composition comprising admixing together about 98% by weight of monomeric di-ethylene glycol bis allyl carbonate, a small amount of a polymerization promotor for the di-ethylene glycol bis allyl carbonate, and an effective amount to reduce roughening caused by etchants up to about 2% by weight of a alkyl phthalic acid ester; and then heating the composition to polymerize the di-ethylene glycol bis allyl carbonate into a solid transparent polymer with the phthalic acid ester incorporated therein.

12. The method of claim 11 wherein the ester substituent portion of the phthalic acid ester consists of at least two or more carbon atoms.

13. The method of claim 11 wherein the phthalic acid ester is dioctyl phthalate.

14. A method for producing an improved nuclear particle track recording CR-39 plastic composition comprising adding to said CR-39 when in the monomeric state, an anti-roughening agent in an amount of up to about 2% by weight of the composition, thereafter polymerizing the CR-39 to produce a polymeric CR-39 plastic solid composition including the anti-roughening agent therein.

15. The method of claim 14 wherein the anti-roughening agent is a phthalic acid ester wherein the ester substituent portion consists of at least 2 or more carbon atoms.

* * * * *